United States Patent [19]

Ushirogouchi et al.

[11] Patent Number: 4,988,601

[45] Date of Patent: Jan. 29, 1991

[54] PHOTOSENSITIVE RESIN COMPOSITION WITH O-QUINONE DIAZIDE AND NOVOLAC RESINS PREPARED FROM MIXED PHENOLIC REACTANTS TO INCLUDE 3,5-XYLENOL AND 2,5-XYLENOL

[75] Inventors: Toru Ushirogouchi, Yokohama; Shuji Hayase, Kawasaki; Yasunobu Onishi; Rumiko Horiguchi, both of Yokohama, all of Japan

[73] Assignee: Kabushiki Kaisha Toshiba, Kawasaki, Japan

[21] Appl. No.: 275,967

[22] Filed: Nov. 25, 1988

[30] Foreign Application Priority Data

Nov. 26, 1987 [JP] Japan ................................ 62-297971
Mar. 26, 1988 [JP] Japan ................................ 63-72734

[51] Int. Cl.$^5$ .......................... G03F 7/023; G03C 1/60
[52] U.S. Cl. ..................................... 430/192; 430/165; 430/175; 430/176; 430/191; 430/193; 430/325; 430/326
[58] Field of Search .............. 430/192, 193, 165, 191, 430/176, 197

[56] References Cited

U.S. PATENT DOCUMENTS 4,551,409 11/1985 Gulla et al. .......................... 430/192
4,719,167 1/1988 Miura et al. ......................... 430/192
4,731,319 3/1988 Kohara et al. ....................... 430/192

FOREIGN PATENT DOCUMENTS 2180842 4/1987 United Kingdom .

OTHER PUBLICATIONS

English Translation of Japanese Patent Publication #60-164,740, published 8/27/1985 (Hosaka et al.).

*Primary Examiner*—Charles L. Bowers, Jr.
*Attorney, Agent, or Firm*—Oblon, Spivak, McClelland, Maier & Neustadt

[57] ABSTRACT

A photosensitive resin composition having high heat resistance, sensitivity, and resolution performance, including a novolak resin prepared by condensing 2,5-xylenol with m-cresol and/or p-cresol using a carbonyl compound, a novolak resin prepared by condensing 3,5-xylenol with m-cresol and/or p-cresol, and a photosensitive reagent. In addition, four other types of photosensitive resin compositions are disclosed.

5 Claims, No Drawings

PHOTOSENSITIVE RESIN COMPOSITION WITH O-QUINONE DIAZIDE AND NOVOLAC RESINS PREPARED FROM MIXED PHENOLIC REACTANTS TO INCLUDE 3,5-XYLENOL AND 2,5-XYLENOL

BACKGROUND OF THE INVENTION

1. Field of the Invention

The present invention relates to a photosensitive resin composition which can be effectively used in forming a fine resist pattern. This photosensitive resin composition is called a photoresist and is widely used in a planar processing by photolithography such as a manufacturing process of a semiconductor device.

2. Description of the Prior Art

In order to realize a multifunction and high performance of an electronic device such as an LSI, an integration degree and a packing density of an electronic device have been greatly increased. In order to achieve a high packing density, an improvement in photolithography for enabling micropatterning is the most significant subject.

One factor of the photolithography is etching. For this reason, dry etching such as reactive ion etching (RIE) suitable for micropatterning is widely used.

Another factor of the photolithography is a photoresist. In order to realize micropatterning, a photoresist must satisfy the following two requirements.

First, a resist pattern which is sufficiently fine to achieve micropatterning and high packing density of a device can be formed by exposure and development. This resist pattern consists of a number of resist lines having a predetermined width and thickness and spaces between the resist lines. Therefore, in order to satisfy this requirement, resolution of the photoresist must be increased further.

Second, each resist line formed by exposure and development must have a high heat resistance sufficient as an etching mask for RIE. If the heat resistance is not sufficient, the resist lines deform during RIE. For example, even if the line initially has a sharp edge shape, a slope having a round edge portion is formed. When such deformation occurs, pattern transfer cannot be correctly performed to an underlying substrate by etching.

In order to satisfy the above requirements, Japanese Patent Publication No. 52-29261 discloses a photoresist consisting of a homopolymer or copolymer of vinylphenol or derivative thereof and a photosensitive reagent. However, although a resist pattern formed by this conventional photoresist has a high heat resistance, its resolution is not sufficient. For this reason, this photoresist cannot be used for manufacturing a highly-integrated LSI which must have a design rule of about 0.8 μm.

SUMMARY OF THE INVENTION

It is an object of the present invention to provide a photosensitive resin composition which can form a resist pattern having high sensitivity and high resolution capable of satisfying the requirements in the current fine lithography or those in near future and having a high heat resistance so that the resist pattern does not deform when it is exposed to dry etching such as RIE.

The above object of the present invention is achieved by each of the following five photosensitive resin compositions.

A first photosensitive resin composition comprises:

novolak resin (a) prepared by condensing 2,5-xylenol, with m-cresol and/or p-cresol with a carbonyl compound;

novolak resin (b) prepared by condensing 3,5-xylenol, with m-cresol and/or p-cresol with a carbonyl compound; and a photosensitive reagent.

A second photosensitive resin composition comprises, in addition to the first photosensitive resin composition, copolymer (c) represented by formula (I):

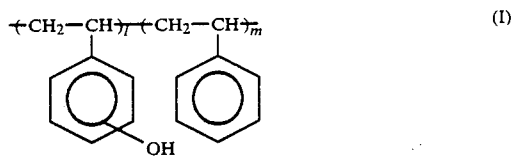

wherein each of l and m independently represents an integer of one or more.

A third photosensitive resin composition contains another novolak resin (d) in place of novolak resins (a) and (b) in the first photosensitive resin composition. Novolak resin (d) is prepared by condensing at least one compound selected from the group consisting of 2,5-xylenol, 3,5-xylenol, m-cresol and p-cresol with a polymer represented by formula (II) using a carbonyl compound:

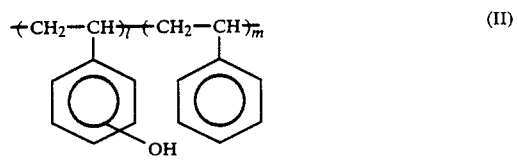

wherein l represents an integer of one or more and m represents an integer including 0.

Note that a difference between formulas (I) and (II) is that m includes 0 in formula (II).

A fourth photosensitive resin composition contains another novolak resin (e) in place of resin component (a) in the first photosensitive resin composition. Novolak resin (e) is prepared by condensing 2,5-xylenol, m-cresol and/or p-cresol with a polymer represented by formula (II) using a carbonyl compound. That is, novolak resin (e) differs from novolak resin (a) in that in resin (e), a unit of formula (II) is also included as a copolymer unit.

A fifth photosensitive resin composition contains another novolak resin (f) in place of resin component (b) in the first photosensitive resin composition. Novolak resin (f) is prepared by condensing 3,5-xylenol, m-cresol and/or p-cresol with a polymer represented by formula (II) using a carbonyl compound. That is, novolak resin (f) differs from novolak resin (b) in that in resin (f), a unit of formula (II) is also included as a copolymer unit.

DETAILED DESCRIPTION OF THE PREFERRED EMBODIMENT

Five photosensitive resin compositions (to be referred to as photoresists hereinafter) of the present invention commonly contain a novolak resin having at least one member selected from the group consisting of 2,5-xylenol, 3,5-xylenol, m-cresol, and p-cresol as a monomer unit.

Resin components (a) to (f) used in the present invention will be described below.

Any of novolak resins (a), (b), and (d) to (f) is prepared by a condensation reaction using a carbonyl compound. Examples of the carbonyl compound are aldehydes such as formaldehyde, acetaldehyde, banzaldehyde, and benzylaldehyde. In addition, a ketone such as acetone which produces an aldehyde as a reaction intermediate can be used.

In novolak resins (a) and (b), a ratio between the respective units can be basically an arbitrary value. However, it is normally preferable that a xylenol unit content is 5 to 50 mol % and the balance is m-cresol and/or p-cresol. If the ratio falls outside this range, resolution of the photoresist may be reduced. The molecular weight of novolak resins (a) and (b) are preferably $1 \times 10^3$ to $5 \times 10^5$, and more preferably, $3 \times 10^3$ to $1 \times 10^5$. If the molecular weight is less than $1 \times 10^3$, a heat resistance of resist lines formed by exposing and developing the photoresist may be degraded. If the molecular weight exceeds $5 \times 10^5$, flowability of synthesized novolak resin (a) or (b) becomes poor. As a result, it is difficult to separate the resin from a reaction vessel by decantation.

Regarding the copolymer (c) and the novolak resin (d), a ratio between number l of vinylphenol units and number m of styrene units contained in copolymer (c) of formula (I) and a polymer of formula (II) can be varied in accordance with a mixing amount of a photosensitive reagent in the second photoresist. For example, if a mixing amount of the photosensitive reagent, which is represented as the number of moles of photosensitive groups per gram of a solid component of the photoresist, is about 0.8 mMol, l:m is preferably about 10:1. If the number of moles of photosensitive groups is about 0.5 mMol, l:m is preferably about 15:85. The molecular weight of copolymer (c) is preferably $1 \times 10^3$ to $1 \times 10^5$, and more preferably, $1 \times 10^3$ to $2 \times 10^4$.

In novolak resin (d), a structure of a cross-linking part differs in accordance with the type of a carbonyl compound used in condensation. For example, novolak resin (d) prepared by a condensation reaction using acetaldehyde is represented by formula (III). Novolak resin (d) prepared by a condensation reaction using formaldehyde is represented by formula (IV). Therefore, the resin is not limited to that having a specific cross-linking part.

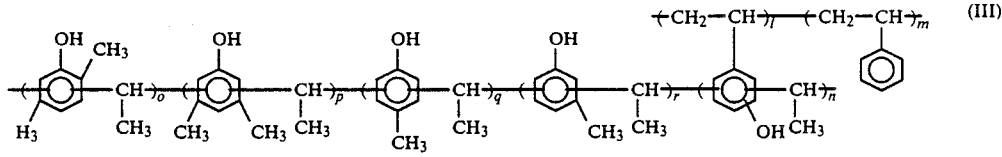

wherein each of l and n independently represents an integer of one or more, m represents an integer including 0, at least one of o, p, q, and r represents an integer of one or more, and each of the others independently represents an integer including 0.

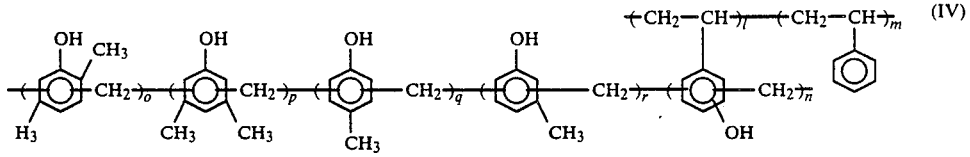

wherein each of l and n independently represents an integer of one or more, m represents an integer including 0, at least one of o, p, q, and r represents an integer of one or more, and each of the others independently represents an integer including 0.

In novolak resin (e), a structure of a cross-linking part also changes in accordance with the type of a carbonyl compound used in condensation. Therefore, the resin is not limited to that having a specific cross-linking part. For example, novolak resin (d) prepared by a condensation reaction using formaldehyde is represented by formula (V):

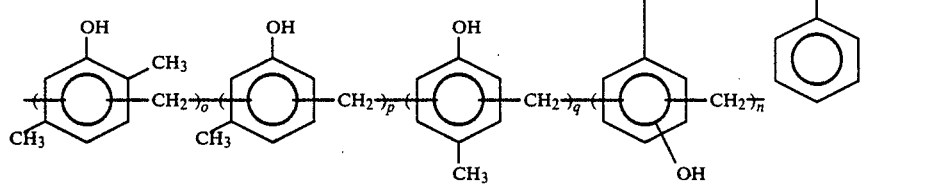

wherein each of l and n independently represents an integer of one or more, m represents an integer including 0, at least one of o, p, q, and r represents an integer of one or more, and each of the others independently represents an integer including 0.

In novolak resin (f), a structure of a cross-linking part also changes in accordance with the type of a carbonyl compound used in condensation. Therefore, the resin is not limited to that having a specific cross-linking part. For example, novolak resin (f) prepared by a condensation reaction using formaldehyde is represented by formula (VI):

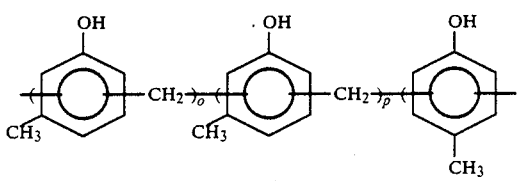
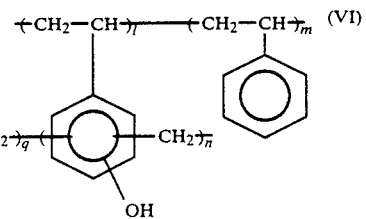

wherein each of l and n independently represents an integer of one or more, m represents an integer including 0, at least one of o, p, q, and r represents an integer of one or more, and each of the others independently represents an integer including 0.

In novolak resins (d), (e) and (f), a ratio between the respective units may be basically an arbitrary value. However, it is normally preferable that a xylenol unit content is 5 to 50 mol %, an m-cresol and/or p-cresol unit content is 5 to 80 mol %, and the content of a vinylphenol unit derived from a polymer of formula (II) is 1 to 40 mol %. If the ratio falls outside this range, resolution and sensitivity of the photoresist may be reduced. For the same reason as that of novolak resins (a) and (b), the molecular weights of novolak resins (d), (e) and (f) are preferably $1 \times 10^3$ to $5 \times 10^5$, and more preferably, $3 \times 10^3$ to $1 \times 10^5$.

A photosensitive reagent used in the present invention will be described below.

In the photoresist of the present invention, either a negative-type or positive-type photosensitive reagent can be used. Examples of the photosensitive reagent are as follows.

(1) P-quinonediazide such as sulfonamide between p-benzoquinonediazide sulfonic acid and β-naphtylamine.

(2) P-iminoquinonediazide described in British Patent Nos. 723,382 and 942,402.

(3) An organic-solvent-soluble condensation product described in British Patent No. 1,110,017 and French Patent No. 2,022,413, which is prepared from a diazonium salt and formaldehyde.

(4) An aryl diazonium salt such as a cocondensation product between, e.g., a p-diazodiphenyl amine salt, 4,4-bismethoxymethyl-diphenyl ether and formaldehyde.

(5) An aryl azide such as an azide compound described in British Patent No. 745,886.

Of the above photosensitive reagents, preferable examples are an o-quinonediazide such as an aryl ester or an aryl amide of o-naphthoquinonediazide sulfonic acid or o-naphthoquinonediazide carbonic acid.

Examples of the most preferable photosensitive reagent are an ester between 2,3,4-trihydroxybenzophenone and 1,2-naphthoquinonediazide sulfonic acid, and an ester between 2,3,4,4'-tetrahydroxybenzophenone and 1,2-naphthoquinonediazide sulfonic acid. The latter contributes to an improvement in a heat resistance of the resist pattern.

Of the esters between 2,3,4,4'-tetrahydroxybenzophenone and 1,2-naphthoquinonediazide sulfonic acid, a 2,3,4,4'-tetrahydroxybenzophenone-1,2-naphthoquinonediazide-5-sulfonic acid ester is suitable as a photosensitive reagent for exposure with g line from a high-voltage mecury lamp. On the other hand, a 2,3,4,4'-tetrahydroxybenzophenone 1,2-naphthoquinonediazide-4-sulfonic acid ester is suitable as a photosensitive reagent for exposure with i line from a high voltage mercury lamp or ultraviolet rays having a shorter wavelength. In these preferable photosensitive reagents, an esterification rate of a hydroxyl group in 2,3,4,4'-tetrahydroxybenzophenone is preferably 40 to 100%. This means that an average number of introduced naphthoquinonediazides (photosensitive groups) per molecule of the photosensitive reagent is 1.6 to 4 (the photosensitive reagent is generally a mixture of compounds in which the numbers of introduced photosensitive groups are 1, 2, 3 and 4, respectively).

The above five photoresists of the present invention will be described below.

As described above, the first photoresist contains novolak resins (a) and (b) and the photosensitive reagent as essential components. Among the two resin component, mixing ratio of novolak resin (a) is preferably 30 to 70 wt %, and that of novolak resin (b) is preferably 70 to 30 wt %.

A mixing amount of the photosensitive reagent cannot be unconditionally defined because it changes in accordance with ratios between monomer units which constitute novolak resins (a) and (b) and a mixing ratio of novolak resins (a) and (b). However, normally, the mixing amount of the photosensitive reagent is preferably 5 to 40 wt % of a total solid content of the photoresist. If the mixing amount falls outside this range, any of characteristics of the resist, i.e., resolution, a heat resistance, adhesion strength with respect to a substrate, or sensitivity may be significantly degraded. Note that the total solid content of the photoresist means a total amount of the resin components and the photosensitive reagent.

The first photoresist has the following advantages.

Both of novolak resins (a) and (b) have a higher heat resistance than other resin components to be used in a photoresist. In addition, a photosensitive reagent such as a naphthoquinondiazide sulfonic acid ester of 2,3,4,4'-tetrahydroxybenzophenone which contributes to improve a heat resistance is used to further improve the heat resistance.

Both of novolak resins (a) and (b) have a higher resolution performance compared with other resin components used in a photoresist. Therefore, high sensitivity and resolution can be obtained by appropriately selecting a photosensitive reagent.

In addition, the following effect can be obtained by using a combination of novolak resins (a) and (b). Solubility characteristics of novolak resins (a) and (b) with respect to an alkaline developing agent are largely different from each other. That is, in a resist containing only novolak resin (a) as a resin component, a dissolving rate is high at a central portion of a film thickness during development after exposure. On the contrary, in a resist containing only novolak resin (b) as a resin component, a dissolving rate at an upper portion of a film is high. For this reason, if only one of novolak resins (a)

and (b) is used as a resin component, a resist line having a good rectangular profile cannot be formed. However, since a combination of novolak resins (a) and (b) is used in the first photoresist, developing characteristics of both the resins are mutually compensated for to form a resist line having a good profile.

The first photoresist has the above superior characteristics. Therefore, by using the first photoresist, a fine resist pattern having a good profile and high transfer precision can be formed. In addition, since this resist pattern has a sufficient heat resistance, i.e., the resist pattern does not deform during dry etching, pattern transfer can be performed to a substrate by etching with high precision.

As described above, the second photoresist contains novolak resins (a) and (b), copolymer (c) of formula (I), and the photosensitive reagent. That is, the second photoresist differs from the first one only in that copolymer (c) is contained in the second photoresist. A mixing ratio of copolymer (c) depends on ratios between monomer units in novolak resins (a) and (b), a mixing ratio of novolak resins (a) and (b), and ratio (l:m) between monomer units in copolymer (c). Therefore, although the mixing ratio of copolymer (c) cannot be unconditionally defined, it is preferably 0.5 to 40 wt % with respect to 100 parts by weight of the total amount of novolak resins (a) and (b). If the ratio falls outside this range, either resolution or a heat resistance of the resist may be significantly degraded. More preferably, the mixing ratio is 1 to 20 parts by weight.

For the same reason as in the first photoresist, a mixing ratio of the photosensitive reagent is preferably 5 to 40 wt % of a total solid content of the photoresist.

In addition to the advantages of the first photoresist, the second photoresist has the following advantage because copolymer (c) represented by formula (I) is added therein. That is, since copolymer (c) has a high heat resistance, a heat resistance of a formed resist pattern is further improved.

As described above, the third photoresist contains novolak resin (d) and the photosensitive reagent as essential components. A mixing ratio of the photosensitive reagent depends on a ratio between monomer units in novolak resin (d), the type of the photosensitive reagent, and the like. Therefore, although the mixing ratio of the photosensitive reagent cannot be unconditionally defined, it is preferably 0.1 to 50 wt % of a total solid content of the photoresist. If the ratio is less than 0.1 wt %, exposure sensitivity is significantly reduced. If the ratio exceeds 50 wt %, an adhesion strength with respect to a substrate may be reduced.

A monomer component of novolak resin (d) used in the third photoresist is substantially the same as that of novolak resins (a) and (b) and copolymer (c) used in the second photoresist. For this reason, novolak resin (d) has a high heat resistance. Therefore, according to the third photoresist, a resist pattern having a higher heat resistance than that of a conventional resist pattern can be formed. In addition, by using a particular photosensitive reagent such as a naphthoquinonediazide sulfonic acid ester of 2,3,4,4'-tetrahydroxybenzophenone, high sensitivity and resolution can be obtained. Therefore, the same advantages as those of the first and second photoresists can be obtained. Moreover, if a polymer of formula (II) which is a unit in novolak resin (d) is specified to polyvinylphenol (i.e., m=0), solubility in an aqueous alkaline solution can be improved.

As described above, the fourth photoresist contains novolak resins (b) and (e) and the photosensitive reagent as essential components. A mixing ratio ((b)/(e)) between two novolak resins (b) and (e) is preferably 0.6 to 1.5. A mixing ratio of the photosensitive reagent depends on ratio (l:m) between monomer units in novolak resin (e), the type of photosensitive reagent, and the like. Therefore, although the mixing ratio of the photosensitive reagent cannot be unconditionally defined, it is preferably 0.1 to 50 wt% of a total solid content of the photoresist. If the ratio is less than 0.1 wt %, exposure sensitivity may be significantly reduced. If the ratio exceeds 50 wt %, an adhesion strength with respect to a substrate may be reduced.

As described above, novolak resin (b) used in the fourth photoresist has a high heat resistance as a resin component used in a photoresist. Novolak resin (e) is a copolymer of a polymer of formula (II) and novolak resin (a), as described above. For this reason, novolak resin (e) has basic properties of both the substances and therefore a high heat resistance. Since novolak resin (b) and novolak resin (e) having the properties of novolak resin (a) are used in a combination, good properties as those of the first photoresist can be obtained. In addition, by using a particular photosensitive reagent such as a naphthoquinonediazide sulfonic acid ester of 2,3,4,4'-tetrahydroxybenzophenone, high sensitivity and resolution can be obtained, and advantages similar to those of the first and second photoresists can be obtained. Moreover, solubility of the fourth photoresist in an aqueous alkali solution can be improved, by increasing a ratio of polyvinylpenol content in a polymer of formula (II) which is a unit in novolak resin (e).

As described above, the fifth photoresist contains novolak resins (a) and (f) and the photosensitive reagent as essential components. Similar to the fourth photoresist, a mixing ratio ((a)/(f)) between two novolak resins (a) and (f) is preferably 0.6 to 1.5. A mixing ratio of the photosensitive reagent cannot be unconditionally defined as in the fourth photoresist. However, for the same reason as in the fourth photoresist, the mixing ratio of the photosensitive reagent is preferably 0.1 to 50 wt % of a total solid content of the photoresist.

The fifth photoresist is the same as the fourth photoresist except that in the fifth photoresist, a polymer of formula (II) is contained not as a copolymer unit with novolak resin (a) but as a copolymer unit with novolak resin (b). Therefore, the fifth photoresist has the sam advantages as those of the fourth photoresist.

In any of the first to fourth photoresists according to the present invention, various other arbitrary components can be contained if necessary.

A first arbitrary component is an alkali-soluble resin and/or trihydroxybenzene. These components are added in order to increase solubility of the photoresist in an aqueous alkali solution.

The alkali-soluble resin is not limited to a specific one but may be any resin as long as it can be dissolved in an aqueous alkali solution. Examples of the alkali-soluble resin are poly-p-vinylphenol, poly-o-vinylphenol, poly-m-isopropenylphenol, poly-o-isopropenylphenol, a polymer represented by formula (II), a copolymer of p-vinylphenol and methyl methacrylate, a copolymer of p-isopropenylphenol and maleic anhydride, a partial-benzoylation product of poly-p-vinylphenol, polymethacrylic acid, and polyacrylic acid. In particular, polyvinylphenol is most preferable because it improves not only the solubility in alkaline solution but also a heat resistance. The molecular weight of polyvinylphenol is preferably $1 \times 10^3$ to $1 \times 10^5$, and more preferably, $1 \times 10^4$ to $5 \times 10^4$. Of the three isomers of trihydroxybenzene, pyrogallol as an o-isomer is most preferable.

Solubility of polyvinylphenol and trihydroxybenzene in an aqueous alkali solution is reduced by metal catalyzed addition of styrene in a benzene ring. Therefore, solubility can be controlled by an addition degree of styrene.

The content of the alkali-soluble resin and/or trihydroxybenzene is preferably 0.5 to 40 wt % of a total amount of the resin component and photosensitive reagent. If the content is less than 0.5 wt %, a sufficient effect of improving solubility in an aqueous alkali solution cannot be obtained. If the content exceeds 40 wt %, resolution may be reduced.

Other arbitrary components are a uv-absorption reagent, a sensitizer, a stabilizer for increasing storage stability, an anti-halation reagent for preventing halation from a substrate, an adhesion promotor for improving an adhesion strength with respect to a substrate, and a surfactant for smoothening the surface of a coated film. In addition, a polymer for improving quality of a coated film, e.g., an epoxy resin, polymethacrylate, polymethylacrylate, a propyleneoxideethyleneoxide copolymer, and polystyrene may be added.

The photoresist according to the present invention is dissolved in a solvent to be used. A preferable solvent is a cellosolve acetate such as ethylcellosolve acetate and butylcellosolve acetate. Alternatively, a solvent mixture of two or more members selected from the group consisting of ethylcellosolve acetate, butylcellosolve acetate, ethylcellosolve, and methylcellosolve can be preferably used. Note that xylene, toluene, butyl acetate, γ-butyl lactone, dimethylformamide, an aliphatic alcohol such as isopropyl alcohol, or the like may be added to the above solvents, and a small amount of a surface active reagent may be added.

A step of forming a resist pattern on a substrate surface using the photoresist according to the present invention will be described below. Examples of the substrate are a silicon monocrystalline wafer, a silicon wafer having various thin films such as an insulating film or a conductive film deposited thereon, and a mask blank.

First, the photoresist of the present invention is dissolved in a solvent selected from the above solvents, and the obtained solution is uniformly coated on the surface of a substrate. In this case, a spin coating method or dipping method can be adopted as a coating method. Subsequently, the resultant material is dried at a temperature of 120° C or less, and more particularly, 70 to 110° C., thereby forming a photoresist film on the substrate surface.

Then, the photoresist film formed in this manner is exposed to an exposure beam radiated through a predetermined exposure mask. Ultraviolet rays are normally used as the exposure beam. However, if the photoresist is used as a negative type, an exposure beam having a shorter wavelength such as far ultraviolet rays, electron beam, and X rays can be used.

Thereafter, the exposed photoresist film is developed using an aqueous alkaline solution. Examples of the aqueous alkaline solution are a tetramethylammonium hydroxide solution and an aqueous choline solution.

The present invention will be described in more detail below by way of its examples.

EXAMPLES 1–8

(First Photoresist)

Synthesis of Novolak Resin

Oxalic acid was mixed as an acid catalyst in a formalin solution, and a xylenol monomer and a cresol monomer were mixed therein at mixing ratios shown in Table 1. The resultant material was heated to synthesize six types of novolak resins A1 to F1. Table 1 also shows molecular weights of synthesized novolak resins A1 to F1.

Note that in Table 1, each of resins A1, B1 and C1 is novolak resin (a) described above, and each of resins D1, E1 and F1 is novolak resin (b) described above.

Preparation of Photoresist Solution

The above novolak resins and photosensitive reagents were mixed at ratios shown in Table 2. The resultant mixture was dissolved in ethylcellosolve acetate to prepare eight types of photoresist solutions of Examples 1 to 8 shown in Table 2. The amount of ethylcellosolve acetate was 250 parts by weight with respect to 100 parts by weight of a total solid content of the photoresist solution.

Formation of Resist Pattern

The above eight types of photoresist solutions were coated on the hydrophobic surface of silicon wafers by a spin coating method to form 1.5-μm thick resist films. The resist films were baked at 90° C for five minutes and then subjected to pattern exposure using g rays radiated from a high-voltage mercury lamp as a light source by a step and repeat aliner having a numerical aperture of 0.45. Then, a paddle development treatment was performed using a tetramethylammonium hydroxide solution (2.38%) to form resist patterns.

In the paddle development treatment, a developing solution is deposited and detained on a resist film surface by its surface tension. In this method, consumption of a developing solution can be saved as compared with a dipping developing treatment in which the entire wafer is dipped in a developing solution or a spray developing treatment in which a developing solution is sprayed.

Heat resistances, sensitivities, resolution performances, and pattern profiles of the formed resist patterns were examined. The heat resistance was evaluated as a deformation temperature obtained when the resist pattern was heated on a hot plate. The sensitivity was evaluated as an exposure amount (optimal exposure amount) by which a size ratio between lines and spaces of an exposure mask can be accurately reproduced in the resist pattern. The resolution performance was evaluated as resolution obtained by the optimal exposure amount. The pattern profile was evaluated as a sectional shape of a 0.6-μm wide resist line.

For the purpose of comparison, commercially available conventional photoresist compositions were used to form resist patterns (Comparative Examples 1 to 3) following the same procedures as described above. Following the same procedures as described above, heat resistances, sensitivitiesy, resolution performances, and pattern profiles of the resist patterns were examined.

The results of the above examples and comparative examples are summerized in Table 3 below. As is apparent from Table 3, the resist patterns of Examples 1 to 8 have the sensitivities, resolution performances, heat resistances and pattern profiles equal to or higher than those of Comparative Examples 1 to 3.

TABLE 1

| Resin Symbol | Monomer Ratio of Novolak Resin | | | | Molecular Weight Mw |
|---|---|---|---|---|---|
| | 2,5-xylenol (Parts by Weight) | 3,5-xylenol (Parts by Weight) | m-cresol (Parts by Weight) | p-cresol (Parts by Weight) | |
| A1 | 35.0 | — | 45.0 | 25.0 | $0.8 \times 10^4$ |
| B1 | 35.0 | — | 45.0 | 25.0 | $1.2 \times 10^4$ |
| C1 | 35.0 | — | 50.0 | 30.0 | $0.5 \times 10^4$ |
| D1 | — | 40.0 | 36.0 | 24.0 | $0.8 \times 10^4$ |
| E1 | — | 40.0 | 30.0 | 30.0 | $0.5 \times 10^4$ |
| F1 | — | 30.0 | 50.0 | 20.0 | $0.9 \times 10^4$ |

TABLE 2

| Photoresist | Mixing Ratio of Resins and Photosensitive Reagent (Parts by Weight) | | | |
|---|---|---|---|---|
| | Symbol of First Component (Content) | Symbol of Second Component (Content) | Type of Photosensitive Reagent | Content of Photosensitive Reagent |
| Example 1 | A1 (35.0) | D1 (35.0) | 2,3,4,4'-tetrahydroxybenzophenone-5-naphthoquinonediazide Sulfonic Acid Ester | 20.0 |
| Example 2 | B1 (43.8) | D1 (29.2) | 2,3,4,4'-tetrahydroxybenzophenone-5-naphthoquinonediazide Sulfonic Acid Ester | 27.0 |
| Example 3 | C1 (35.0) | E1 (35.0) | 2,3,4,4'-tetrahydroxybenzophenone-5-naphthoquinonediazide Sulfonic Acid Ester | 20.0 |
| Example 4 | A1 (35.0) | E1 (35.0) | 2,3,4,4'-tetrahydroxybenzophenone-5-naphthoquinonediazide Sulfonic Acid Ester | 20.0 |
| Example 5 | A1 (35.0) | F1 (35.0) | 2,3,4,4'-tetrahydroxybenzophenone-5-naphthoquinonediazide Sulfonic Acid Ester | 20.0 |
| Example 6 | C1 (35.0) | F1 (35.0) | 2,3,4,4'-tetrahydroxybenzophenone-5-naphthoquinonediazide Sulfonic Acid Ester | 20.0 |
| Example 7 | A1 (35.0) | D1 (35.0) | 2,3,4,-trihydroxybenzophenone-5-naphthoquinonediazide Sulfonic Acid Ester | 27.0 |
| Example 8 | B1 (43.8) | D1 (29.2) | 2,3,4,-trihydroxybenzophenone-5-naphthoquinonediazide Sulfonic Acid Ester | 27.0 |

TABLE 3

| | Heat Resistance (°C.) | Sensitivity (mJ/cm²) | Resolution Performance (μm) | Pattern Shape (0.6 μm Pattern) |
|---|---|---|---|---|
| Example 1 | 130 | 70 | 0.5 | 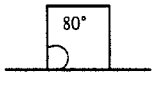 (Wall Angle) 85° |
| Example 2 | 135 | 75 | 0.55 | 80° |
| Example 3 | 130 | 68 | 0.5 | 85° |
| Example 4 | 130 | 72 | 0.5 | 85° |
| Example 5 | 135 | 80 | 0.5 | 80° |
| Example 6 | 130 | 72 | 0.5 | 90° |

TABLE 3-continued

| | Heat Resistance (°C.) | Sensitivity (mJ/cm²) | Resolution Performance (μm) | Pattern Shape (0.6 μm Pattern) |
|---|---|---|---|---|
| Example 7 | 120 | 67 | 0.55 | 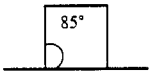 85° |
| Example 8 | 120 | 71 | 0.5 | 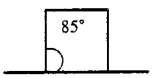 85° |
| Comparative Example 1 | 110 | m-cresol/p-cresol Copolymer 63 Parts by Weight, 2,3,4-trihydroxybenzophenone-5-naphthoquinonediazide Sulfonic Acid Ester 37 Parts by Weight<br>68 | 0.6 | 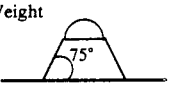 75° |
| Comparative Example 2 | 110 | 3,5-xylenol Novolak Resin 79 Parts by Weight, 2,3,4,4'-tetrahydroxybenzophenone-5-naphthoquinonediazide Sulfonic Acid Ester 21 Parts by Weight<br>70 | 0.6 | 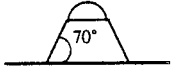 70° |
| Comparative Example 3 | 120 | 2,5-xylenol Novolak Resin 77 Parts by Weight, 2,3,4,4'-tetrahydroxybenzophenone-5-naphthoquinonediazide Sulfonic Acid Ester 21 Parts by Weight<br>70 | 0.6 | 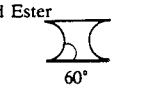 60° |

EXAMPLES 9-21

(Second Photoresist)

Synthesis of Novolak Resin

Oxalic acid was mixed as an acid catalyst in a formalin solution, and a xylenol monomer and a cresol monomer were mixed therein at mixing ratios shown in Table 4. The resultant material was heated to synthesize four types of novolak resin A2 to D2. Table 4 also shows molecular weights of synthesized novolak resins A2 to D2.

Note that in Table 4, each of resins A2 and D2 is novolak resin (a) described above, and each of resins B2 and D2 is novolak resin (b) described above.

Preparation of Photoresist Solution

The above novolak resins, a copolymer of formula (I) shown in Table 5, and a photosensitive reagent were mixed at ratios shown in Table 6. As the photosensitive reagent, a 2,3,4,4'-tetrahydroxybenzophenone-1,2-naphthoquinonediazide-5-sulfonic acid ester in which an average esterification value per molecule is 3 was used. This mixture was dissolved in ethylcellosolve acetate to prepare 13 types of photoresist solutions of Examples 9 to 21 shown in Table 6. The amount of ethylcellosolve acetate was 250 parts by weight with respect to 100 parts by weight of a total solid content of the resist.

For the purpose of comparison, three types of resist solutions shown as comparative examples in Table 6 were prepared. As is apparent from compositions of resin components, Comparative Examples 4 to 6 fall outside the range of the second photoresist according to the present invention.

Formation of Resist Patterns

Following the same procedures as in Examples 1 to 8, resist patterns were formed using photoresist solutions of Examples 9 to 21 and Comparative Examples 4 to 6.

Following the same procedures as in Examples 1 to 8, heat resistances, sensitivitiesy, and resolution performances of the formed resist patterns were examined.

The results of the examples and comparative examples are listed in Table 7. As is apparent from Table 7, the resist patterns of Examples 9 to 21 have the sensitivities, resolution performances, and heat resistances equal to or higher than those of Comparative Examples 4 to 6.

TABLE 4

| | Monomer Ratio of Novolak Resin | | | | |
|---|---|---|---|---|---|
| Resin Symbol | 2,5-xylenol (Parts by Weight) | 3,5-xylenol (Parts by Weight) | m-cresol (Parts by Weight) | p-cresol (Parts by Weight) | Molecular Weight Mw |
| A2 | 35.0 | — | 45.0 | 25.0 | 0.8 × 10⁴ |
| B2 | — | 28.6 | 42.8 | 28.6 | 1.0 × 10⁴ |
| C2 | 17.5 | 14.3 | 43.9 | 26.8 | 0.9 × 10⁴ |
| D2 | — | — | 64.3 | 35.7 | 0.8 × 10⁴ |

TABLE 5

Copolymer of Formula (I)

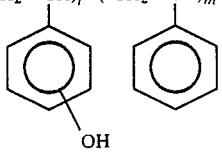

| Resin Symbol | Ratio of l | Ratio of m | Molecular Weight (Mw) |
|---|---|---|---|
| E2 | 15 | 85 | $0.5 \times 10^4$ |
| F2 | 50 | 50 | $1.0 \times 10^4$ |
| G2 | 70 | 30 | $0.7 \times 10^4$ |

TABLE 6

| Photoresist | Photoresist Composition (Parts by Weight) | | | | | | | Photosensitive Reagent |
|---|---|---|---|---|---|---|---|---|
| | Novolak Resin (Resin Symbol) | | | | | | | |
| | A2 | B2 | C2 | D2 | E2 | F2 | G2 | |
| Example 9 | 38.5 | 38.5 | — | — | 2 | — | — | 21 |
| Example 10 | 34.5 | 34.5 | — | — | — | 10 | — | 21 |
| Example 11 | 32.0 | 32.0 | — | — | — | — | 15 | 21 |
| Example 12 | — | — | 69 | — | — | 10 | — | 21 |
| Example 13 | — | — | 64 | — | — | — | 15 | 21 |
| Example 14 | — | — | — | 60 | — | 20 | — | 20 |
| Example 15 | — | — | — | 50 | — | — | 30 | 20 |
| Example 16 | 38.0 | 38.0 | — | — | 4 | — | — | 20 |
| Example 17 | — | — | 65 | — | — | 15 | — | 20 |
| Example 18 | — | — | 60 | — | — | — | 20 | 20 |
| Example 19 | 38.0 | 38.0 | — | — | 5 | — | — | 19 |
| Example 20 | 30.5 | 30.5 | — | — | — | 20 | — | 19 |
| Example 21 | — | — | — | 46 | — | — | 35 | 19 |
| Comparative Example 4 | 39.5 | 39.5 | — | — | — | — | — | 21 |
| Comparative Example 5 | — | — | 79 | — | — | — | — | 21 |
| Comparative Example 6 | — | — | — | 80 | — | — | — | 20 |

TABLE 7

| | Heat Resistance (°C.) | Sensitivity (mJ/cm²) | Resolution Performance |
|---|---|---|---|
| Example 9 | 135 | 70 | 0.50 |
| Example 10 | 145 | 72 | 0.55 |
| Example 11 | 150 | 69 | 0.6 |
| Example 12 | 145 | 70 | 0.50 |
| Example 13 | 150 | 67 | 0.55 |
| Example 14 | 135 | 25 | 0.60 |
| Example 15 | 145 | 19 | 0.65 |
| Example 16 | 140 | 65 | 0.50 |
| Example 17 | 150 | 70 | 0.55 |
| Example 18 | 155 | 68 | 0.60 |
| Example 19 | 140 | 67 | 0.50 |
| Example 20 | 150 | 71 | 0.60 |

TABLE 7-continued

| | Heat Resistance (°C.) | Sensitivity (mJ/cm²) | Resolution Performance |
|---|---|---|---|
| Example 21 | 160 | 18 | 0.65 |
| Comparative Example 4 | 125 | 60 | 0.65 |
| Comparative Example 5 | 130 | 65 | 0.65 |
| Comparative Example 6 | 110 | 20 | 0.70 |

EXAMPLES 22–41

(Third Photoresist)

Synthesis of Novolak Resin

Oxalic acid was mixed as an acid catalyst in a formalin solution, and a xylenol monomer and a cresol monomer were mixed therein at mixing ratios shown in Table 8. The resultant material was heated to synthesize 11 types of novolak resins A3 to K3. Table 8 also shows molecular weights of synthesized novolak resins A3 to K3.

Note that in Table 8, each of resins A3 to K3 is novolak resin (d) described above.

Preparation of Photoresist Solution

The above novolak resins, a photosensitive reagent, and a third component such as polyvinylphenol were mixed at ratios shown in Table 9. This mixture was dissolved in ethylcellosolve acetate to prepare 20 types of photoresist solutions of Examples 22 to 41 shown in Table 6. The amount of ethylcellosolve acetate was 250 parts by weight with respect to 100 parts by weight of a total solid content of the resist.

Formation of Resist Patterns

Following the same procedures as in Examples 1 to 8, resist patterns were formed using Examples 22 to 41. For a comparison, following the same procedures as described above, resist patterns were formed (Comparative Examples 7 to 9) using commercially available conventional resist compositions.

Following the same procedures as in Examples 1 to 8, heat resistances, sensitivitiesy, and resolution performances of the formed resist patterns of Examples 22 to 41 and Comparative Examples 7 to 9 were examined.

The results of the examples and comparative examples are listed in Table 10. As is apparent from Table 10, the resist patterns of Examples 22 to 41 have the sensitivities, resolution performances, and heat resistances equal to or higher than those of Comparative Examples 7 to 9.

TABLE 8

Novolak Resin Composition

| Resin Symbol | 2,5-xylenol (Parts by Weight) | 3,5-xylenol (Parts by Weight) | m-cresol (Parts by Weight) | p-cresol (Parts by Weight) | OH (Parts by Weight) | Ratio between l and m in Left Formula | Molecular Weight (Mw) |
|---|---|---|---|---|---|---|---|
| A3 | 14.23 | 14.23 | 42.86 | 23.81 | 4.76 | 70:30 | $0.8 \times 10^4$ |
| B3 | — | 28.46 | 42.86 | 23.81 | 4.76 | 15:85 | $1.2 \times 10^4$ |
| C3 | 14.23 | 14.23 | 42.86 | 23.81 | 4.76 | 15:85 | $1.9 \times 10^4$ |
| D3 | 14.71 | 14.71 | 44.12 | 24.51 | 1.96 | 15:85 | $1.5 \times 10^4$ |

TABLE 8-continued

Novolak Resin Composition $$-(CH-CH)_l-(CH-CH)_m-$$

with phenyl groups, one bearing OH

| Resin Symbol | 2,5-xylenol (Parts by Weight) | 3,5-xylenol (Parts by Weight) | m-cresol (Parts by Weight) | p-cresol (Parts by Weight) | OH (Parts by Weight) | Ratio between l and m in Left Formula | Molecular Weight (Mw) |
|---|---|---|---|---|---|---|---|
| E3 | 14.85 | 14.85 | 44.55 | 24.75 | 1.00 | 15:85 | $1.7 \times 10^4$ |
| F3 | 29.70 | — | 44.60 | 24.75 | 0.99 | 95:5 | $1.2 \times 10^4$ |
| G3 | 29.12 | — | 43.69 | 24.27 | 2.91 | 95:5 | $1.5 \times 10^4$ |
| H3 | 28.57 | — | 42.85 | 23.80 | 4.76 | 95:5 | $1.7 \times 10^4$ |
| I3 | 27.27 | — | 40.91 | 22.73 | 9.09 | 95:5 | $2.1 \times 10^4$ |
| J3 | 25.00 | — | 37.45 | 20.83 | 16.67 | 95:5 | $2.4 \times 10^4$ |
| K3 | 21.43 | — | 32.14 | 17.86 | 28.57 | 95:5 | $3.0 \times 10^4$ |

TABLE 9

Photoresist Composition

| Photoresist | Novolak Resin Resin Symbol | Novolak Resin Mixing Amount (Parts by Weight) | Photosensitive Reagent Type | Photosensitive Reagent Mixing Amount (Parts by Weight) | Third Component Type | Third Component Mixing Amount (Parts by Weight) |
|---|---|---|---|---|---|---|
| Example 22 | A3 | 70 | 1,2-naphthoquinonediazide Sulfonic Acid Ester of 2,2',4,4'-tetrahydroxybenzophenone (Introduction Rate = 2.5) | 30 | — | — |
| Example 23 | B3 | 70 | 1,2-naphthoquinonediazide Sulfonic Acid Ester of 2,2',4,4'-tetrahydroxybenzophenone (Introduction Rate = 2.5) | 30 | — | — |
| Example 24 | C3 | 70 | 1,2-naphthoquinonediazide Sulfonic Acid Ester of 2,2',4,4'-tetrahydroxybenzophenone (Introduction Rate = 2.5) | 30 | — | — |
| Example 25 | D3 | 80 | 1,2-naphthoquinonediazide Sulfonic Acid Ester of 2,3,4,4'-tetraphydroxybenzophenone (Introduction Rate = 3.0) | 20 | — | — |
| Example 26 | D3 | 70 | 1,2-naphthoquinonediazide Sulfonic Acid Ester of 2,3,4,4'-tetraphydroxybenzophenone (Introduction Rate = 2.5) | 30 | — | — |
| Example 27 | D3 | 75 | 1,2-naphthoquinonediazide Sulfonic Acid Ester of 2,3,4,4'-tetraphydroxybenzophenone (Introduction Rate = 2.5) | 25 | — | — |
| Example 28 | D3 | 80 | 1,2-naphthoquinonediazide Sulfonic Acid Ester of 2,3,4,4'-tetraphydroxybenzophenone (Introduction Rate = 3.0) | 20 | — | — |
| Example 29 | E3 | 73 | 1,2-naphthoquinonediazide Sulfonic Acid Ester of 2,3,4,4'-tetraphydroxybenzophenone (Introduction Rate = 3.0) | 27 | — | — |
| Example 30 | F3 | 73 | 1,2-naphthoquinonediazide Sulfonic Acid Ester of 2,3,4,4'-tetraphydroxybenzophenone (Introduction Rate = 3.0) | 27 | — | — |
| Example 31 | G3 | 73 | 1,2-naphthoquinonediazide Sulfonic Acid Ester of 2,3,4,4'-tetraphydroxybenzophenone (Introduction Rate = 3.0) | 27 | — | — |
| Example 32 | H3 | 73 | 1,2-naphthoquinonediazide Sulfonic Acid Ester of 2,3,4,4'-tetraphydroxybenzophenone (Introduction Rate = 3.0) | 27 | — | — |
| Example 33 | I3 | 73 | 1,2-naphthoquinonediazide Sulfonic Acid Ester of 2,3,4,4'-tetraphydroxybenzophenone (Introduction Rate = 3.0) | 27 | — | — |
| Example 34 | J3 | 73 | 1,2-naphthoquinonediazide Sulfonic Acid Ester of 2,3,4,4'-tetraphydroxybenzophenone (Introduction Rate = 3.0) | 27 | — | — |

TABLE 9-continued

| | Photoresist Composition | | | | | |
|---|---|---|---|---|---|---|
| | Novolak Resin | | Photosensitive Reagent | | Third Component | |
| Photoresist | Resin Symbol | Mixing Amount (Parts by Weight) | Type | Mixing Amount (Parts by Weight) | Type | Mixing Amount (Parts by (Weight) |
| Example 35 | K3 | 71 | 1,2-naphthoquinonediazide Sulfonic Acid Ester of 2,3,4,4'-tetraphydroxybenzophenone (Introduction Rate = 3.0) | 27 | Polyvinyl Phenol | 2 |
| Example 36 | G3 | 68 | 1,2-naphthoquinonediazide Sulfonic Acid Ester of 2,3,4,4'-tetraphydroxybenzophenone (Introduction Rate = 3.0) | 27 | Polyvinyl Phenol | 5 |
| Example 37 | G3 | 63 | 1,2-naphthoquinonediazide Sulfonic Acid Ester of 2,3,4,4'-tetraphydroxybenzophenone (Introduction Rate = 3.0) | 27 | Polyvinyl Phenol | 10 |
| Example 38 | G3 | 53 | 1,2-naphthoquinonediazide Sulfonic Acid Ester of 2,3,4,4'-tetraphydroxybenzophenone (Introduction Rate = 3.0) | 27 | Polyvinyl Phenol | 20 |
| Example 39 | G3 | 71 | 1,2-naphthoquinonediazide Sulfonic Acid Ester of 2,3,4,4'-tetraphydroxybenzophenone (Introduction Rate = 3.0) | 27 | Pyrogallol | 2 |
| Example 40 | G3 | 68 | 1,2-naphthoquinonediazide Sulfonic Acid Ester of 2,3,4,4'-tetraphydroxybenzophenone (Introduction Rate = 3.0) | 27 | Pyrogallol | 5 |
| Example 41 | G3 | 63 | 1,2-naphthoquinonediazide Sulfonic Acid Ester of 2,3,4,4'-tetraphydroxybenzophenone (Introduction Rate = 3.0) | 27 | Pyrogallol | 10 |

TABLE 10

| Photoresist | | Heat Resistance (°C.) | Sensitivity (mJ/cm$^2$) | Resolution Performance ($\mu$m) |
|---|---|---|---|---|
| Example 22 | | 130 | 48 | 0.60 |
| Example 23 | | 135 | 70 | 0.60 |
| Example 24 | | 130 | 80 | 0.60 |
| Example 25 | | 135 | 76 | 0.55 |
| Example 26 | | 130 | 74 | 0.55 |
| Example 27 | | 135 | 70 | 0.55 |
| Example 28 | | 135 | 76 | 0.55 |
| Example 29 | | 135 | 86 | 0.55 |
| Example 30 | | 140 | 80 | 0.55 |
| Example 31 | | 140 | 76 | 0.55 |
| Example 32 | | 145 | 64 | 0.60 |
| Example 33 | | 150 | 54 | 0.60 |
| Example 34 | | 155 | 50 | 0.60 |
| Example 35 | | 135 | 76 | 0.55 |
| Example 36 | | 140 | 70 | 0.55 |
| Example 37 | | 150 | 64 | 0.60 |
| Example 38 | | 155 | 48 | 0.60 |
| Example 39 | | 135 | 76 | 0.55 |
| Example 40 | | 135 | 64 | 0.60 |
| Example 41 | | 130 | 48 | 0.60 |
| Comparative Example 7 | TSMR-8800 (TOKYO OHKA KOGYO CO., LTD.) | 110 | 68 | 0.60 |
| Comparative Example 8 | MCPR-2000H (Mitsubishi Chemical Industrie Ltd.) | 120 | 70 | 0.60 |
| Comparative Example 9 | RFR-7750 (Japan Synthetic Rubber Co., Ltd.) | 120 | 70 | 0.60 |

EXAMPLES 42–56

(Fourth and Fifth Photoresists)

Synthesis of Novolak Resin

Oxalic acid was mixed as an acid catalyst in a formalin solution, and a xylenol monomer, a cresol monomer, and a polymer of formula (II) were mixed therein at mixing ratios shown in Table 11. The resultant material was heated to synthesize 12 types of novolak resins A4 to L4. Table 11 also shows molecular weights of synthesized novolak resins A4 to L4.

Note that in Table 11, each of resins A4, B4 and E4 is novolak resin (b) described above, each of resins C4 and D4 is novolak resin (a), each of resins F4 to H4 is novolak resin (e), and each of resins I4 to K4 is novolak resin (f). Resin L4 is a novolak resin not used in the present invention.

Preparation of Photoresist Solution

The above novolak resins and a photosensitive reagent were mixed at ratios shown in Table 12. This mixture was dissolved in ethylcellosolve acetate to prepare 14 types of photoresist solutions of Examples 42 to 56 shown in Table 6. The amount of ethylcellosolve acetate was 250 parts by weight with respect to 100 parts by weight of a total solid content of the resist.

For the purpose of comparison, following the same procedures as described above, photoresist solutions were prepared (Comparative Examples 10 to 14) using resin L4 shown in Table 11.

Formation of Resist Patterns

Following the same procedures as in Examples 1 to 8, resist patterns were formed using Examples 42 to 56 and Comparative Examples 10 to 14.

Following the same procedures as in Examples 1 to 8, heat resistances, sensitivitiesy, and resolution performances of the formed resist patterns were examined.

The results of the examples and comparative examples are listed in Table 13. As is apparent from Table 13, the resist patterns of Examples 42 to 56 have the sensitivities, resolution performances, and heat resistances equal to or higher than those of Comparative Examples 10 to 14.

TABLE 11

| | Novolak Resin Composition | | | | | |
|---|---|---|---|---|---|---|
| Resin Symbol | 2,5-xylenol (Parts by Weight) | 3,5-xylenol (Parts by Weight) | m-cresol (Parts by Weight) | p-cresol (Parts by Weight) | $+CH-CH\!\!\!+_l+CH-CH\!\!\!+_m$ with OH on left ring (Parts by Weight) | Ratio between l and m in Left Formula |
| A4 | — | 33.33 | 42.86 | 23.81 | — | — |
| B4 | — | 28.46 | 47.73 | 23.81 | — | — |
| C4 | 33.33 | — | 42.86 | 23.81 | — | — |
| D4 | 31.37 | — | 44.12 | 24.51 | — | — |
| E4 | — | 30.70 | 44.55 | 24.75 | — | — |
| F4 | 29.70 | — | 44.60 | 24.75 | 0.95 | 95:5 |
| G4 | 29.12 | — | 43.69 | 24.27 | 2.92 | 95:5 |
| H4 | 29.85 | — | 42.85 | 23.80 | 3.50 | 95:5 |
| I4 | — | 27.27 | 45.50 | 22.73 | 4.50 | 95:5 |
| J4 | — | 25.50 | 52.17 | 20.83 | 2.00 | 95:5 |
| K4 | — | 21.43 | 59.71 | 17.86 | 1.00 | 95:5 |
| L4 | — | — | 60.00 | 40.00 | — | — |

TABLE 12

| | Photoresist Composition | | | | |
|---|---|---|---|---|---|
| | Novolak Resin | | | Photosensitive Reagent | |
| Photoresist | Resin Symbol | Resin Mixing Ratio | Mixing Amount | Type | Mixing Amount (Parts by Weight) |
| Example 42 | A4/F4 | 1:1 | 70 | 1,2-naphthoquinonediazide Sulfonic Acid Ester of 2,2′,4,4′-tetrahydroxybenzophenone (Introduction Rate = 2.5) | 30 |
| Example 43 | A4/G4 | 1:1 | 70 | 1,2-naphthoquinonediazide Sulfonic Acid Ester of 2,2′,4,4′-tetrahydroxybenzophenone (Introduction Rate = 2.5) | 30 |
| Example 44 | A4/H4 | 1:1 | 70 | 1,2-naphthoquinonediazide Sulfonic Acid Ester of 2,2′,4,4′-tetrahydroxybenzophenone (Introduction Rate = 2.5) | 30 |
| Example 45 | B4/F4 | 1:1 | 80 | 1,2-naphthoquinonediazide Sulfonic Acid Ester of 2,3,4,4′-tetraphydroxybenzophenone (Introduction Rate = 3.0) | 20 |
| Example 46 | B4/G4 | 1:1 | 70 | 1,2-naphthoquinonediazide Sulfonic Acid Ester of 2,3,4,4′-tetraphydroxybenzophenone (Introduction Rate = 2.5) | 30 |
| Example 47 | B4/H4 | 1:1 | 75 | 1,2-naphthoquinonediazide Sulfonic Acid Ester of 2,3,4,4′-tetraphydroxybenzophenone (Introduction Rate = 2.5) | 25 |
| Example 48 | C4/I4 | 1:1 | 80 | 1,2-naphthoquinonediazide Sulfonic Acid Ester of 2,3,4,4′-tetraphydroxybenzophenone (Introduction Rate = 3.0) | 20 |
| Example 49 | C4/J4 | 1:1 | 73 | 1,2-naphthoquinonediazide Sulfonic Acid Ester of 2,3,4,4′-tetraphydroxybenzophenone (Introduction Rate = 3.0) | 27 |
| Example 50 | C4/K4 | 1:1 | 73 | 1,2-naphthoquinonediazide Sulfonic Acid Ester of 2,3,4,4′-tetraphydroxybenzophenone (Introduction Rate = 3.0) | 27 |
| Example 51 | D4/I4 | 1:1 | 73 | 1,2-naphthoquinonediazide Sulfonic Acid Ester of 2,3,4,4′-tetraphydroxybenzophenone (Introduction Rate = 3.0) | 27 |
| Example 52 | D4/J4 | 1:1 | 73 | 1,2-naphthoquinonediazide Sulfonic Acid Ester of 2,3,4,4′-tetraphydroxybenzophenone (Introduction Rate = 3.0) | 27 |
| Example 53 | D4/K4 | 1:1 | 73 | 1,2-naphthoquinonediazide Sulfonic Acid Ester of 2,3,4,4′-tetraphydroxybenzophenone (Introduction Rate = 3.0) | 27 |
| Example 54 | E4/I4 | 1:1 | 73 | 1,2-naphthoquinonediazide Sulfonic Acid Ester of 2,3,4,4′-tetraphydroxybenzophenone (Introduction Rate = 3.0) | 27 |
| Example 55 | E4/J4 | 1:1 | 73 | 1,2-naphthoquinonediazide Sulfonic Acid Ester of 2,3,4,4′-tetraphydroxybenzophenone (Introduction Rate = 3.0) | 27 |

TABLE 12-continued

| | Photoresist Composition | | | | |
|---|---|---|---|---|---|
| | Novolak Resin | | | Photosensitive Reagent | |
| Photo-resist | Resin Symbol | Resin Mixing Ratio | Mixing Amount | Type | Mixing Amount (Parts by Weight) |
| Example 56 | E4/K4 | 1:1 | 73 | 1,2-naphthoquinonediazide Sulfonic Acid Ester of 2,3,4,4'-tetraphydroxybenzophenone (Introduction Rate = 3.0) | 27 |
| Comparative Example 10 | L4/F4 | 1:1 | 73 | 1,2-naphthoquinonediazide Sulfonic Acid Ester of 2,3,4,4'-tetraphydroxybenzophenone (Introduction Rate = 3.0) | 27 |
| Comparative Example 11 | L4/H4 | 1:1 | 73 | 1,2-naphthoquinonediazide Sulfonic Acid Ester of 2,3,4,4'-tetraphydroxybenzophenone (Introduction Rate = 3.0) | 27 |
| Comparative Example 12 | L4/J4 | 1:1 | 73 | 1,2-naphthoquinonediazide Sulfonic Acid Ester of 2,3,4,4'-tetraphydroxybenzophenone (Introduction Rate = 3.0) | 27 |
| Comparative Example 13 | L4/K4 | 1:1 | 73 | 1,2-naphthoquinonediazide Sulfonic Acid Ester of 2,3,4,4'-tetraphydroxybenzophenone (Introduction Rate = 3.0) | 27 |
| Comparative Example 14 | L4/I4 | 1:1 | 73 | 1,2-naphthoquinonediazide Sulfonic Acid Ester of 2,3,4,4'-tetraphydroxybenzophenone (Introduction Rate = 3.0) | 27 |

TABLE 13

| Photoresist | Heat Resistance (°C.) | Sensitivity (mJ/cm$^2$) | Resolution Performance ($\mu$m) |
|---|---|---|---|
| Example 42 | 135 | 41 | 0.55 |
| Example 43 | 135 | 45 | 0.55 |
| Example 44 | 135 | 49 | 0.55 |
| Example 45 | 135 | 31 | 0.55 |
| Example 46 | 135 | 62 | 0.55 |
| Example 47 | 135 | 62 | 0.55 |
| Example 48 | 140 | 35 | 0.55 |
| Example 49 | 140 | 45 | 0.55 |
| Example 50 | 140 | 45 | 0.55 |
| Example 51 | 140 | 43 | 0.55 |
| Example 52 | 140 | 49 | 0.55 |
| Example 53 | 140 | 49 | 0.55 |
| Example 54 | 135 | 45 | 0.55 |
| Example 55 | 135 | 49 | 0.55 |
| Example 56 | 135 | 45 | 0.55 |
| Comparative Example 10 | 120 | 60 | 0.70 |
| Comparative Example 11 | 125 | 62 | 0.70 |
| Comparative Example 12 | 110 | 55 | 0.70 |
| Comparative Example 13 | 110 | 70 | 0.70 |
| Comparative Example 14 | 120 | 75 | 0.70 |

What is claimed is:

1. A photosensitive resin composition comprising: an admixture of a novolak resin (a) prepared by condensing 2,5-xylenol, m-cresol and/or p-cresol with a carbonyl compound; a novolak resin (b) prepared by condensing 3,5-xylenol, m-cresol and/or p-cresol with a carbonyl compound; and an o-quinonediazide photosensitive reagent in a photosensitizing amount, wherein the amount of resin (a) is 30 to 70 wt % and the amount of resin (b) is 70 to 30 wt % as based on the total amount of resin present in the composition.

2. A composition according to claim 1, wherein said carbonyl compound is selected from the group consisting of formaldehyde, acetaldehyde, benzaldehyde, benzylaldehyde and acetone.

3. A composition according to claim 1, wherein said photosensitive reagent is an ester of 2,3,4-trihydroxbenzophenone and 1,2-naphthoquinonediazide sulfonic acid.

4. A composition according to claim 1, wherein said photosensitive reagent is an ester of 2,3,4,4'-tetrahydroxybenzophenone and 1,2-naphthoquinonediazide sulfonic acid.

5. A composition according to claim 1, further comprising polyvinyl phenol and/or pyrogallol.

* * * * *